United States Patent
Pham et al.

(10) Patent No.: US 8,535,971 B2
(45) Date of Patent: Sep. 17, 2013

(54) METHOD FOR APPLYING FULL BACK SURFACE FIELD AND SILVER BUSBAR TO SOLAR CELL

(75) Inventors: Tung Thanh Pham, West Conshohocken, PA (US); Weiming Zhang, Blue Bell, PA (US)

(73) Assignee: Heraeus Precious Metals North America Conshohocken LLC, West Conshohocken, PA (US)

(*) Notice: Subject to any disclaimer, the term of this patent is extended or adjusted under 35 U.S.C. 154(b) by 267 days.

(21) Appl. No.: 13/024,773

(22) Filed: Feb. 10, 2011

(65) Prior Publication Data

US 2011/0197960 A1   Aug. 18, 2011

Related U.S. Application Data

(60) Provisional application No. 61/304,030, filed on Feb. 12, 2010.

(51) Int. Cl.
*H01L 21/00* (2006.01)
*H01L 31/00* (2006.01)

(52) U.S. Cl.
USPC ........... 438/98; 438/97; 257/E31.11; 136/256

(58) Field of Classification Search
USPC ................ 438/97, 98; 257/E31.11; 136/256
See application file for complete search history.

(56) References Cited

U.S. PATENT DOCUMENTS

| | | |
|---|---|---|
| 4,163,678 A | 8/1979 | Frosch et al. |
| 4,643,913 A | 2/1987 | Okunaka et al. |

(Continued)

FOREIGN PATENT DOCUMENTS

| | | |
|---|---|---|
| EP | 1 321 441 A1 | 6/2003 |
| EP | 1 713 093 A2 | 10/2006 |

(Continued)

OTHER PUBLICATIONS

Cheek, Garry C. et al., Thick-Film Metallization For Solar Cell Applications; IEEE Transaction on Electron Devices, vol. Ed-31, No. 5, May 1984, pp. 602-609.*

(Continued)

*Primary Examiner* — Wensing Kuo
*Assistant Examiner* — Moazzam Hossain
(74) *Attorney, Agent, or Firm* — Blank Rome LLP

(57) ABSTRACT

A method is provided for applying back contact silver busbars to an aluminum back surface field (BSF) of a solar cell. The method involves providing a solar cell substrate having a front side and a back side; printing a full aluminum backing layer on the back side of the solar cell substrate; drying the printed aluminum backing layer to yield a full aluminum layer; printing and drying a peeling paste on the full aluminum layer in areas where the silver busbars are desired; printing and drying a front contact silver paste on the front side of the solar cell substrate to produce a front grid electrode; co-firing and cooling the front and back sides of the solar cell, wherein during firing the peeling paste wets excess aluminum powder in the aluminum layer, such that during cooling of the solar cell the peeling paste contracts, solidifies, and peels off with the excess aluminum powder to leave a full aluminum BSF having open areas; and printing, drying, and firing a back contact silver paste on the open areas of the BSF to yield silver busbars.

15 Claims, 10 Drawing Sheets

(56) References Cited

U.S. PATENT DOCUMENTS

| | | |
|---|---|---|
| 5,840,432 A | 11/1998 | Hirai et al. |
| 5,899,704 A | 5/1999 | Schlosser et al. |
| 6,225,392 B1 | 5/2001 | Sunahara |
| 6,265,090 B1 | 7/2001 | Nishide et al. |
| 7,462,304 B2 | 12/2008 | Wang et al. |
| 7,494,607 B2 | 2/2009 | Wang et al. |
| 7,510,673 B2 | 3/2009 | Ohtani et al. |
| 7,597,769 B2 | 10/2009 | Hampden-Smith et al. |
| 2005/0268963 A1 | 12/2005 | Jordan et al. |
| 2006/0183307 A1* | 8/2006 | Rohatgi et al. ............... 438/563 |
| 2006/0289055 A1 | 12/2006 | Sridharan et al. |
| 2007/0079868 A1 | 4/2007 | Rose et al. |
| 2007/0256733 A1 | 11/2007 | Karakida et al. |
| 2007/0295381 A1 | 12/2007 | Fujii et al. |
| 2008/0000519 A1 | 1/2008 | Takahashi |
| 2008/0178930 A1 | 7/2008 | Konno |
| 2008/0230119 A1 | 9/2008 | Akimoto |
| 2009/0194151 A1 | 8/2009 | Ishikawa et al. |
| 2009/0211626 A1 | 8/2009 | Akimoto |
| 2009/0211635 A1 | 8/2009 | Niira et al. |
| 2010/0059116 A1 | 3/2010 | Brenner et al. |
| 2011/0139238 A1* | 6/2011 | Hang et al. ............... 136/256 |

FOREIGN PATENT DOCUMENTS

| | | |
|---|---|---|
| EP | 1 892 767 A1 | 2/2008 |
| JP | 8-148375 A | 6/1996 |
| JP | 10-106349 A | 4/1998 |
| WO | 2009/052141 A1 | 4/2009 |
| WO | 2009/152238 A2 | 12/2009 |

OTHER PUBLICATIONS

A. Halm et al., "Low Temperature Pads on Al-Emitter or Al-BSF," Proceedings of the 24th Eur. Photovoltaic Sci. Eng. Conf., 2009, pp. 1462-1464.

R. Kopecek et al., "Large Area Screen Printed N-Type Silicon Solar Cells with Rear Aluminium Emitter: Efficiencies Exceeding 16%," Conference Record of the 2006 IEEE 4th World Conference on Photovoltaic Energy Conversion, May 1, 2006, pp. 1044-1047.

Search Report and Written Opinion dated May 25, 2012, cited in PCT Patent Application No. PCT/US2011/024503.

* cited by examiner

Voc Before and After Low Temperature Re-firing

FF Before and After Low Temperature Re-firing

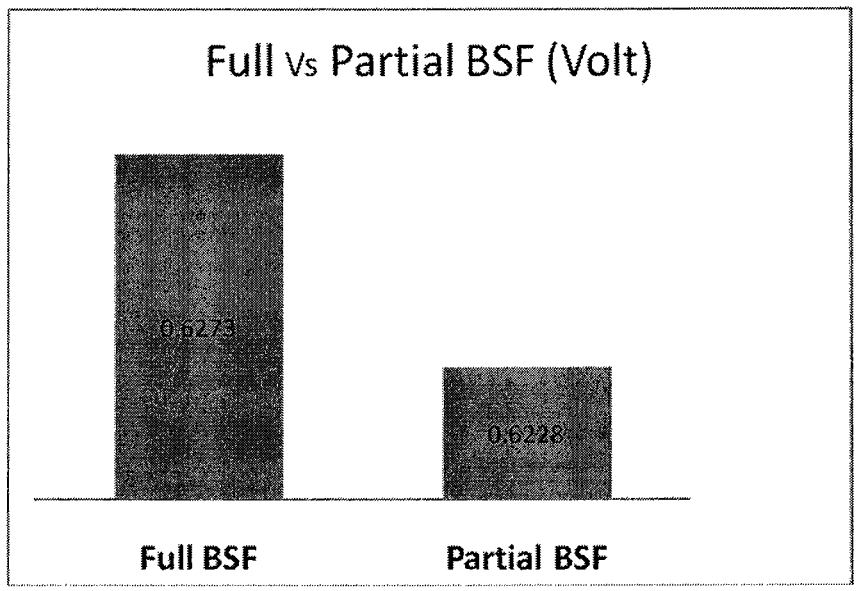
Fig. 13- Voc on 6"x6" multi-crystalline silicon solar cells
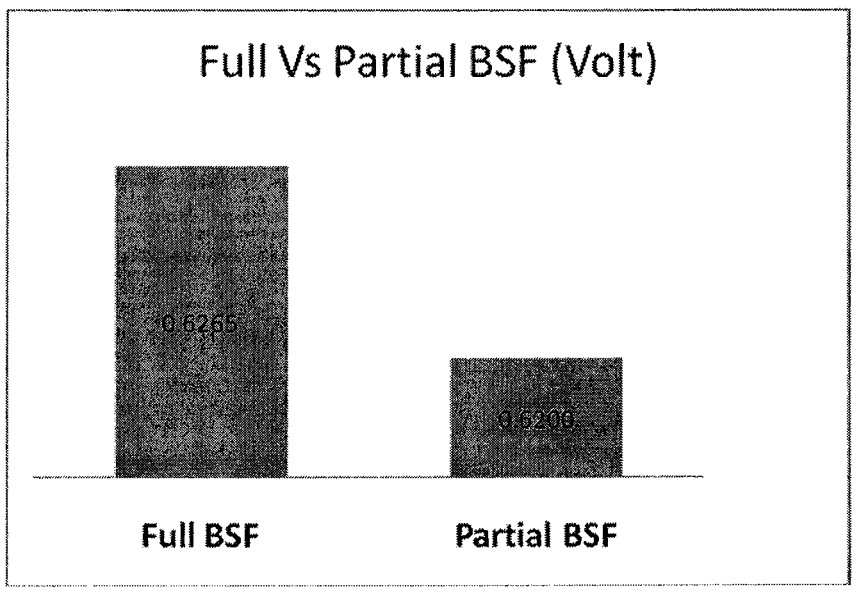
Fig. 14- Voc on 5"x5" mono-crystalline silicon solar cells

METHOD FOR APPLYING FULL BACK SURFACE FIELD AND SILVER BUSBAR TO SOLAR CELL

CROSS-REFERENCE TO RELATED APPLICATIONS

This application claims the benefit of U.S. Provisional Patent Application No. 61/304,030, filed Feb. 12, 2010, the disclosure of which is herein incorporated by reference in its entirety.

BACKGROUND OF THE INVENTION

Solar cells are devices that convert the sun's energy into electricity using the photovoltaic effect. Solar power is an attractive energy source because it is sustainable and non-polluting. Accordingly, a great deal of research is currently being devoted to developing solar cells with enhanced efficiency while maintaining low material and manufacturing costs. Very simply, when photons in sunlight hit a solar panel, they are absorbed by semiconducting materials, such as silicon. Electrons are knocked loose from their atoms, allowing them to flow through electroconductive parts of the solar panel and produce electricity.

The most common solar cells are those based on silicon, more particularly, a p-n junction made from silicon by applying an n-type diffusion layer onto a p-type silicon substrate, coupled with two electrical contact layers or electrodes. In order to minimize reflection of the sunlight by the solar cell, an antireflection coating, such as silicon nitride, is applied to the n-type diffusion layer to increase the amount of light coupled into the solar cell. Using a silver paste, for example, a grid-like metal contact may be screen printed onto the antireflection layer to serve as a front electrode. This electrical contact layer on the face or front of the cell, where light enters, is typically present in a grid pattern made of "finger lines" and "bus bars" rather than a complete layer because the metal grid materials are not transparent to light. Finally, a rear contact is applied to the substrate, such as by applying a back side silver or silver/aluminum paste to the tabbing areas of backside followed by applying an aluminum paste to the remaining areas of the back surface. The device is then fired at a high temperature to convert the metal pastes to metal electrodes. A description of a typical solar cell and the fabrication method thereof may be found, for example, in European Patent Application Publication No. 1 713 093.

The conventional method for building the back side of a solar cell involves printing a dry back contact silver busbar, then printing dry aluminum to cover the rest of the back surface. A full aluminum back surface field (BSF) is desirable to improve solar cell performance. However, printing and drying aluminum to cover the entire back surface of a substrate and then printing and drying a silver back contact on top of the dried aluminum is not feasible because peeling of the silver film and the aluminum base support underneath are observed upon co-firing. Further, methods that involve printing, drying, and firing aluminum and then printing, drying, and firing silver busbars are also not feasible due to the lack of adhesion between silver and aluminum. Accordingly, a method in which silver and dried aluminum are co-fired would be desirable.

Aluminum BSF is the most economical process in the mass production of silicon based solar cells to form a back surface field and creating a low high junction, while acting as an impurity getter and providing partial surface passivation. However, the relatively poor solderability of aluminum is a barrier to forming a full BSF. Additionally, aluminum is loosely bonded by glass systems and thus does not create a firm base for printing metal connecting terminals. An improved method for applying aluminum BSFs would be desirable.

BRIEF SUMMARY OF THE INVENTION

These and other objects are achieved according to the present invention by a method for applying back contact silver busbars to an aluminum back surface field (BSF) of a solar cell comprising:
(a) providing a solar cell substrate having a front side and a back side;
(b) printing a full aluminum backing layer on the back side of the solar cell substrate;
(c) drying the printed aluminum backing layer to yield a full aluminum layer;
(d) printing and drying a peeling paste on the full aluminum layer in areas where silver busbar is desired;
(e) printing and drying a front contact silver paste on the front side of the solar cell substrate to produce a front grid electrode;
(f) co-firing and cooling the front and back sides of the solar cell, wherein during firing the peeling paste wets excess aluminum powder in the aluminum layer, such that during cooling of the solar cell the peeling paste contracts, solidifies, and peels off with the excess aluminum powder to leave a full aluminum BSF having open areas; and
(g) printing, drying, and firing a back contact silver paste on the open areas of the BSF to yield silver busbars.

According to another aspect of the invention, a solar cell is formed by:
(a) providing a solar cell substrate having a front side and a back side;
(b) printing a full aluminum backing layer on the back side of the solar cell substrate;
(c) drying the printed aluminum backing layer to yield a full aluminum layer;
(d) printing and drying a peeling paste on the full aluminum layer in areas where silver busbars are desired;
(e) printing and drying a front contact silver paste on the front side of the solar cell substrate to produce a front grid electrode;
(f) co-firing and cooling the front and back sides of the solar cell, wherein during firing the peeling paste wets excess aluminum powder in the full aluminum layer, such that during cooling of the solar cell the peeling paste contracts, solidifies, and peels off with the excess aluminum powder to leave a full aluminum BSF having open areas; and
(g) printing, drying, and firing a back contact silver paste to the open areas of the BSF to yield silver busbars.

BRIEF DESCRIPTION OF THE DRAWINGS

The foregoing summary, as well as the following detailed description of the invention, will be better understood when read in conjunction with the appended drawing. For the purpose of illustrating the invention, there are shown in the drawings embodiments which are presently preferred. It should be understood, however, that the invention is not limited to the precise arrangements and instrumentalities shown. In the drawings:

FIG. 13 is a graph of Voc on a 6×6 wafer of a full BSF according to an embodiment of the invention and a partial BSF according to a comparative example; and FIG. 14 is a graph of Voc on a 5×5 wafer of a full BSF according to an embodiment of the invention and a partial BSF according to a comparative example.

DETAILED DESCRIPTION OF THE INVENTION

As used herein, unless otherwise indicated for specific case, all percentages (%) are percent by weight. Further, unless otherwise indicated, all particle sizes or particle diameters stated herein are $d_{50}$ particle diameters measured by laser diffraction. As well understood by those skilled in the art, a $d_{50}$ diameter represents the size at which half of the individual particles (by weight) are smaller than the specified diameter.

The application relates to a method for applying back contact silver busbar to the full aluminum back surface field (BSF) of a solar cell. As described in more detail below, the method involves first printing and drying a full aluminum backing layer on the back side of a solar cell substrate to form a full aluminum layer and then applying a peeling paste (described in more detail below) to the full aluminum layer in areas where silver busbars are desired. A front contact silver paste is applied to the front side of the solar cell substrate, and both sides of the cell are co-fired and then cooled. During firing the peeling paste wets excess aluminum powder in the full aluminum layer, such that during cooling of the co-fired solar cell the paste contracts, solidifies, and peels off with the excess aluminum powder to leave a full aluminum BSF having open areas. In other words, slots are created for applying silver back contact paste on top of a solid aluminum-silicon eutectic layer. Finally, a back contact silver paste is applied on the open areas, or slots, of the BSF to yield silver busbars.

By this novel concept and design, cell performance is improved due to higher open circuit voltage. Further, the cell maintains its reliability due to good adhesion and solderability of low temperature firing back contact silver busbars to the substrate. The solar cells produced according to this method also have a desirable full BSF. A BSF functions to reduce electron-hole recombination at the back of the solar cell, thereby increasing cell efficiency. Accordingly, a full BSF improves efficiency of the solar cell.

Figure 1:
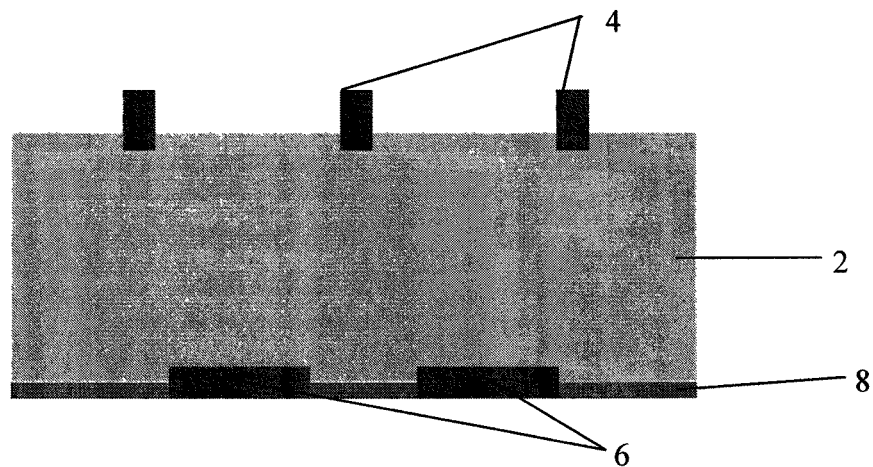
FIG. 1 is a schematic diagram of a solar cell with partial back surface field (BSF)
Figure 2:
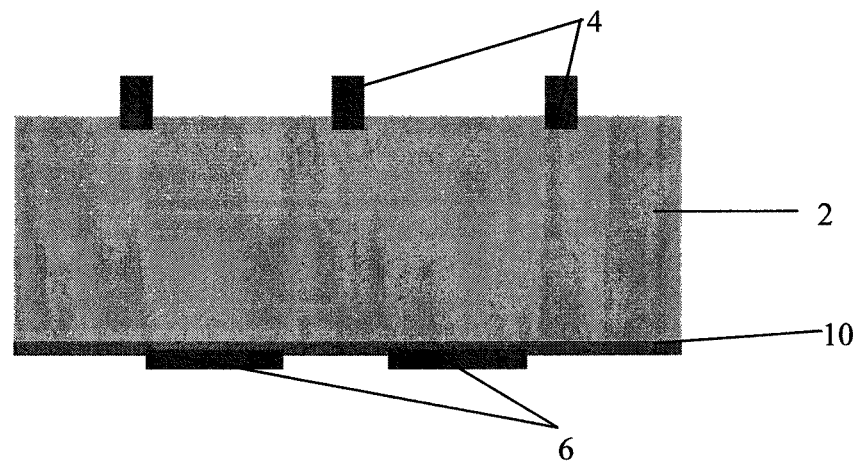
FIG. 2 is a schematic diagram of a solar cell with full back surface field (BSF)

FIGS. 1 and 2 show schematically a comparison between a solar cell with a partial BSF (FIG. 1) and a cell with a full BSF (FIG. 2). In each figure, a silicon substrate 2 has front silver fingers 4 and silver back contacts 6. The solar cell in FIG. 1 has a partial BSF 8, whereas the solar cell in FIG. 2 has a full BSF 10.

The steps of the method of the invention will now be described in more detail.

Application of Full Aluminum Back Layer

In the first step of the method, a full aluminum backing layer is applied to the back side of a solar cell substrate. Preferably, the substrate is a silicon substrate made by applying an n-type diffusion layer onto a p-type silicon substrate. Appropriate substrates may be monocrystalline or multicrystalline and are well known in the art.

Aluminum pastes appropriate for application to solar cell substrates are well known in the art and need not be described. An aluminum paste is applied to the whole back side of the substrate by screen printing, for example, and dried at about 150° C.-200° C. to yield a full aluminum back layer. Such printing and drying steps are well known in the art.

Application of Peeling Paste and Front Contact Silver

Figure 3:
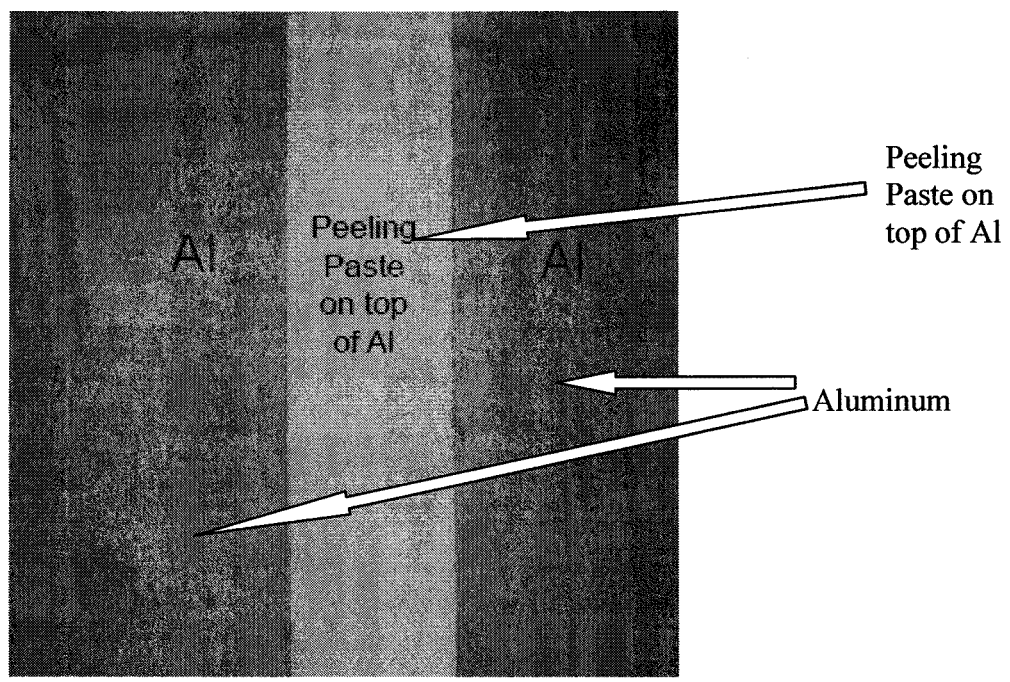
FIG. 3 is a photograph of a solar cell substrate with peeling paste applied to the full aluminum layer according to one embodiment of the invention.

Subsequently, a peeling paste is applied to the full aluminum layer in areas where silver busbars are desired. The peeling paste is a metal-based composition that will be described in more detail below. The paste is applied by known methods, such as by screen printing, and then dried at about 150° C.-200° C. A photograph of a solar cell substrate with peeling paste applied to the full aluminum layer is shown in FIG. 3.

A front contact silver paste is next applied to the front side of the solar cell substrate. Front contact silver pastes are well known in the art, and commercially available silver pastes would be appropriate for application to the front side of the solar cell. It is also within the scope of the invention to first apply an anti-reflection layer, such as silicon nitride, titanium oxide, or silicon oxide, to the front side of the substrate prior to application of the front contact silver paste. The silver paste may be applied by known methods, such as by screen printing, and then dried at about 150° C.-200° C.

Co-firing and Cooling

After printing and drying the front contact paste, the wafer is subjected to metallization and contact formation steps. Specifically, the solar cell with applied aluminum layer, peeling paste, and front contact silver paste is now fired so that the front and back sides are co-fired. Preferably, the solar cell is co-fired in an IR lamp-heated furnace using industrial standard solar cell processing temperature settings. For example, a BTU 6 zone IR-lamp heated furnace may be used. Appropriate temperature and belt speed settings may be determined by routine experimentation but preferably involve a peak temperature of about 700 to 800° C., more preferably about 750 to 800° C. An exemplary temperature profile includes zone settings at 400, 400, 550, 700, 800, and 920° C. and a 5000 mm/min belt speed. Subsequently, the solar cell is fast cooled, such as at about 60 to 80° C. per second, to room temperature.

Figure 4:
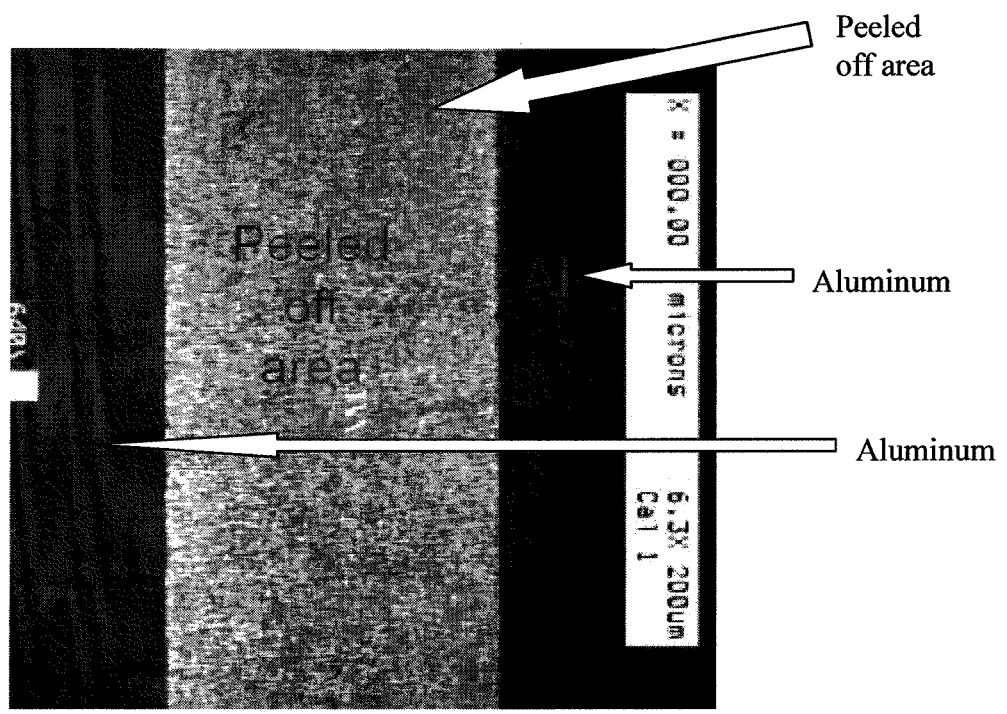
FIG. 4 is a photograph of the peeled off area of an aluminum BSF after firing according to an embodiment of the invention.

During fast process firing (also known in the art as "spike firing"), an aluminum-silicon eutectic is formed around 575 to 600° C. At higher temperatures, the peeling paste starts to melt and wet excess aluminum powder in the aluminum backing layer. During fast cooling, the peeling paste contracts, solidifies, and peels off with the excess aluminum powder to leave a full aluminum BSF with open areas in the BSF layer. In other words, the solid aluminum-silicon eutectic layer is exposed, and will serve as a base for the back contact silver busbars to adhere. A photograph of a solar cell after firing and peeling, illustrating the peeled off (open) areas on the BSF, is shown in FIG. 4.

Application of Back Contact Silver Paste

Figure 5:
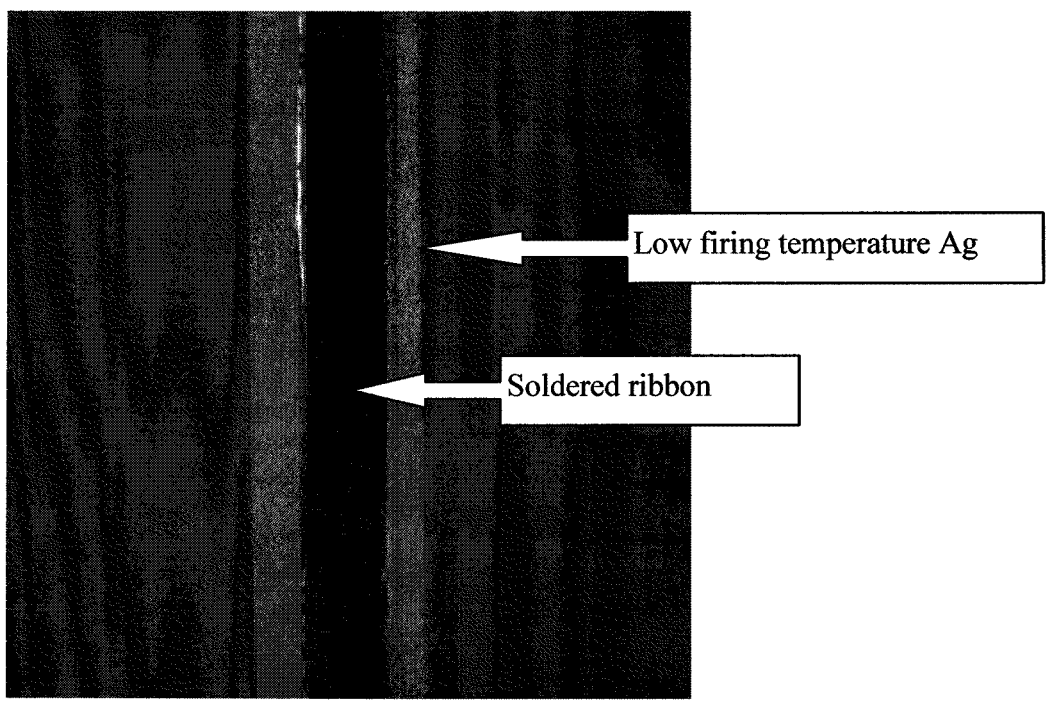
FIG. 5 is a photograph of a silver busbar on an aluminum BSF according to another embodiment of the invention.
Figure 6:
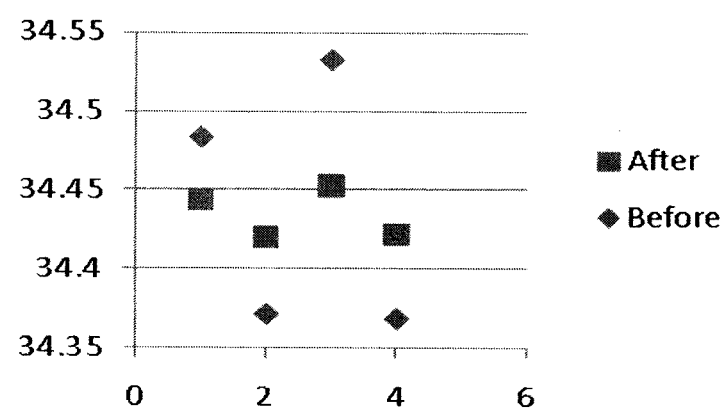
FIG. 6 is a graph of Jsc before and after low temperature re-firing of a solar cell according to one embodiment of the invention.
Figure 7:
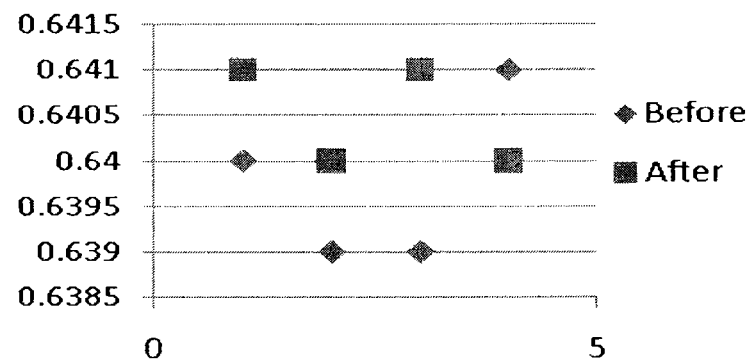
FIG. 7 is a graph of Voc before and after low temperature re-firing of a solar cell according to another embodiment of the invention.
Figure 8:
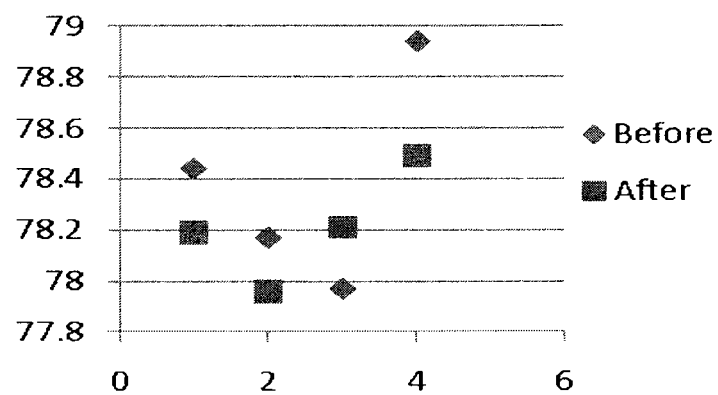
FIG. 8 is a graph of FF before and after low temperature re-firing of a solar cell according to a further embodiment of the invention.
Figure 9:
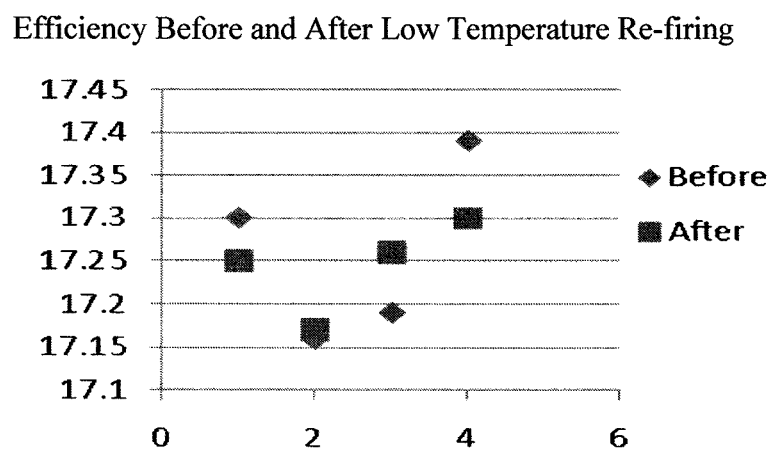
FIG. 9 is a graph of efficiency before and after low temperature re-firing of a solar cell according to an embodiment of the invention.

Finally, a back contact silver paste is applied to the open areas of the BSF, such as by screen printing, then dried at about 150 to 200° C. and fired at low temperature (below about 550° C., such as about 500° C.) for several seconds so that it sinters and adheres to the solid aluminum-silicon eutectic surface and forms busbars. An appropriate back contact silver paste is a low temperature (below about 550° C.) firing material, such as the paste described in more detail below. A photograph of a solar cell with silver bus bar applied to aluminum BSF is shown in FIG. 5.

Peeling Paste

The peeling paste, which is printed and dried on the full aluminum layer, is designed to co-fire with and to melt and wet the aluminum powder in the aluminum layer after aluminum-silicon eutectic formation and then peel off together with the excess aluminum powder to expose the eutectic layer. The paste, like a conventional silver paste, contains an organic system of solvent and binder, comprising 10-30% by weight based on the total weight of the composition, and an inorganic system, comprising 70-90 wt % based on the total weight of the composition. The inorganic system comprises two parts: a glass system (3-20 total wt %) and a powder system (30-80 total wt %). The powder system, glass system, and organic system constitute the three essential components of the peeling paste composition. Each component in the peeling paste composition will now be described in more detail.

Powder System

The powder system contains one or more of the following powders:
(a) silver powder having a particle size of 0.1 to 5.0 microns;
(b) metal powder having a particle size of 0.1 to 5.0 microns; and/or
(c) metal oxide(s) having a particle size of 0.1 to 5.0 microns, such that the metal oxide binds with the aluminum powder and shrinks during firing.

Preferable powder systems include silver flake and silver combined with copper or tin. The role of the powder system is to bind with the aluminum powder when applied to the aluminum layer and shrink during firing.

The metal or metal oxide particles may be included in the composition in powder or flake form provided that they have a particle size of about 0.1 to 5.0 microns. The powder system is preferably present in the peeling paste composition in an amount of about 30-80 weight % based on the total weight of the composition, more preferably about 50-80 weight %.

Glass System

The glass system comprises glass frit (glass particles) and functions as an inorganic binder in the peeling paste composition. The specific type of glass is not critical provided that it can give the desired properties to the paste composition. Preferred glasses include lead borosilicate and bismuth borosilicate, but other lead-free glasses, such as zinc borosilicate, would also be appropriate. The glass particles preferably have a particle size of about 0.1 to about 4.5 microns and a Tg of 300-800° C., more preferably about 300-350° C., and are preferably contained in the composition in an amount of about 3 to about 20 weight %, more preferably about 3 to about 10 weight %, based on the total weight of the paste composition.

Organic System

The organic system comprises a solvent and a binder. The particular solvent and binder are not critical and may be ones known in the art or to be developed for this type of application. For example, a preferred organic vehicle contains a cellulose resin and a solvent, such as ethylcellulose in a solvent such as terpineol. The organic vehicle is preferably present in the electroconductive paste composition in an amount of about 10 to about 30% by weight based on the total weight of the composition.

It is also within the scope of the invention to include additives in the peeling paste composition. For example, it may be desirable to include thickener (tackifier), stabilizer, dispersant, viscosity adjuster, etc. compounds, alone or in combination. Such components are well known in the art. The amounts of such components, if included, may be determined by routine experimentation depending on the properties of the peeling paste that are desired.

The peeling paste composition may be prepared by any method for preparing a paste composition known in the art or to be developed; the method of preparation is not critical. For example, the paste components may be mixed, such as with a mixer, then passed through a three roll mill, for example, to make a dispersed uniform paste. It is also within the scope of the invention to utilize a conventional silver paste as the peeling paste provided that it functions effectively in the method.

Back Contact Paste

The invention also relates to a low temperature back contact paste which may be applied to the peeled-off areas on the BSF. The paste may be printed, dried, and low temperature fired at less than about 550° C., such as about 500° C., on top of the peeled off areas. The back contact paste provides a back contact terminal and solderability of surfaces. Importantly, the back contact paste must be firable at less than about 550° C.

The paste contains an organic system (comprising solvent and binder) which comprises about 10-30 wt % of the paste, and an inorganic system (comprising a glass system and a powder system) which comprises about 70-90% by weight of the paste.

Powder System

The powder system is a conventional powder system known in the art and contains the following powders:
(a) silver powder having a particle size of 0.1 to 5.0 microns in an amount of 50-80 wt %; and
(b) metal oxides having a particle size of 0.5 to 3.0 microns in an amount of 0 to 2.0 wt %. The powder system preferably contains a major portion of silver to provide sufficient solderability. A preferred powder contains silver or silver combined with copper oxide.

The metal or metal oxide particles may be included in the composition in powder or flake form provided that they have a particle size of about 0.1 to 5.0 microns.

Glass System

The glass system comprises glass fit (glass particles) and functions as an inorganic binder in the peeling paste composition. The specific type of glass is not critical provided that it can give the desired properties to the paste composition. Preferred glasses include lead borosilicate and bismuth borosilicate, but other lead-free glasses, such as zinc borosilicate, would also be appropriate. The glass particles preferably have a particle size of about 1.0 to about 4.5 microns and a Tg of 250-600° C., more preferably 250-350° C., and are preferably contained in the composition in an amount of about 3 to about 20 weight % based on the total weight of the paste composition. The relatively low Tg is critical for providing the resulting composition with appropriate low-temperature sintering properties.

Organic System

The organic system is a conventional organic system known in the art and comprises a solvent and a binder. The particular solvent and binder are not critical and may be one known in the art or to be developed for this type of application. For example, a preferred organic vehicle contains a cellulose resin and a solvent, such as ethylcellulose in a solvent such as terpineol. The organic vehicle is preferably present in the electro conductive paste composition in an amount of about 10 to about 30% by weight based on the total weight of the composition.

It is also within the scope of the invention to include additives in the back contact paste composition. For example, it may be desirable to include thickener (tackifier), stabilizer, dispersant, viscosity adjuster, etc. compounds, alone or in combination. Such components are well known in the art. The amounts of such components, if included, may be determined by routine experimentation depending on the properties of the peeling paste that are desired.

The back contact paste compositions may be prepared by any method for preparing a paste composition known in the art or to be developed; the method of preparation is not critical. For example, the paste components may be mixed, such as with a mixer, then passed through a three roll mill, for example, to make a dispersed uniform paste.

Embodiments of the invention will now be described in conjunction with the following, non-limiting example.

Preparation and Analysis of Solar Cells

A peeling paste composition was prepared by combining the components of a conventional silver paste: 70% silver, 8% glass, and 22% vehicle. Four identical solar cells were prepared as follows: On the back side of a ready-to-be metalized P-type mono-crystalline (sc) solar wafer having a sheet resistance of 55Ω/☐ (sc), an aluminum paste (RuXing 8252X) was printed and dried at 150° C. The peeling paste composition was printed on top of the dried aluminum where back contact busbars were desired, and then dried at 150° C. in a box oven for 5 minutes. A commercially available silver paste (CL80-9271, commercially available from Heraeus Incorporated, W. Conshohocken, Pa.) was applied to the front side of the wafer and dried at 150° C. in a box oven for 5 minutes. A resulting cell is shown in FIG. 3. The cells were then subjected to metallization and contact formation by co-firing in an IR lamp heated 6 zone BTU furnace with zone settings of 400° C., 400° C., 550° C., 700° C., 800° C., and 920° C. with 5000 mm/min belt speed. The cells were then cooled rapidly at a rate of 60 to 80° C. per second. A resulting cell, after the excess aluminum had been peeled off, is show in FIG. 4.

The resulting solar cells were tested using an I-V tester. The Xe arc lamp in the I-V tester was used to simulate sunlight with a known intensity and the front surface of the solar cell was irradiated to generate the I-V curve. Using this curve, various parameters common to this measurement method which provide for electrical performance comparison were determined, including short circuit current density (Jsc), open circuit voltage (Voc), Fill Factor, energy conversion efficiency (Efficiency), maximum power (Pmax), series resistance (Rse), and shunt resistance (Rsh). The data are compiled in Table 1.

TABLE 1

| Cell Number | Jsc | Voc | Fill Factor | Efficiency | Pmax (W) | Rse (Ω) | Rsh (Ω) |
|---|---|---|---|---|---|---|---|
| | | | Data Collected Before Low Temperature Re-Firing | | | | |
| 1 | 34.483 | 0.64 | 78.44 | 17.3 | 4.21 | 3.68E−03 | 9.85E+00 |
| 2 | 34.371 | 0.639 | 78.17 | 17.16 | 4.178 | 3.86E−03 | 2.17E+01 |
| 3 | 34.532 | 0.639 | 77.97 | 17.19 | 4.184 | 4.02E−03 | 2.39E+01 |
| 4 | 34.368 | 0.641 | 78.94 | 17.39 | 4.233 | 3.43E−03 | 2.53E+01 |

In the solar cell industry, solar cells with full back surface field for increasing cell performance are highly desirable, and such BSFs are part of the silicon-based solar cell evolution for reducing cost per watt of solar cells. The peeling paste composition according to the invention is effective at removing nearly all excess aluminum powder after formation of the back surface field, yielding a solid base for applying low firing temperature back contact silver busbars and giving a boost to solar cell performance. The low temperature re-firing after application of the back contact paste does not significantly affect the electrical performance of the solar cells, and the back contact silver paste according to the invention sinters well at low temperature, has good solderability, and provides adequate adhesion to the substrate. Accordingly, utilization of the inventive method and silver pastes will help the solar industry to step closer to grid parity.

A back contact silver paste containing 70% silver, 4% low Tg glass, and 26% vehicle was applied on top of the peeled off areas and then dried at 150-200° C. and fired at low temperature (550° C.). The low temperature firing back contact silver paste sintered and adhered to the solid aluminum-silicon eutectic surface as silver busbars. As shown in FIG. 5, the sintered silver film was formed directly on top of the aluminum-silicon eutectic surface. Following the second low temperature firing, the electrical performance of the solar cells was measured again as described above. The electrical performance data for the cells are tabulated in Table 2 below. It can be seen that barely any degradation was observed after low temperature re-firing. Graphs of Jsc, Voc, fill factor (FF), and efficiency before and after low temperature re-firing are depicted in FIGS. 6-9.

TABLE 2

Data Collected After Low Temperature Re-Firing

| Cell Number | Jsc | Voc | Fill Factor | Efficiency | Pmax (W) | Rse (Ω) | Rsh (Ω) |
|---|---|---|---|---|---|---|---|
| 1 | 34.444 | 0.641 | 78.19 | 17.25 | 4.199 | 4.01E−03 | 2.28E+01 |
| 2 | 34.42 | 0.64 | 78.96 | 17.17 | 4.18 | 4.24E−03 | 1.84E+01 |
| 3 | 34.453 | 0.641 | 78.21 | 17.26 | 4.201 | 4.03E−03 | 2.24E+01 |
| 4 | 34.422 | 0.64 | 78.49 | 17.3 | 4.21 | 3.83E−03 | 1.60E+01 |

Figure 10:
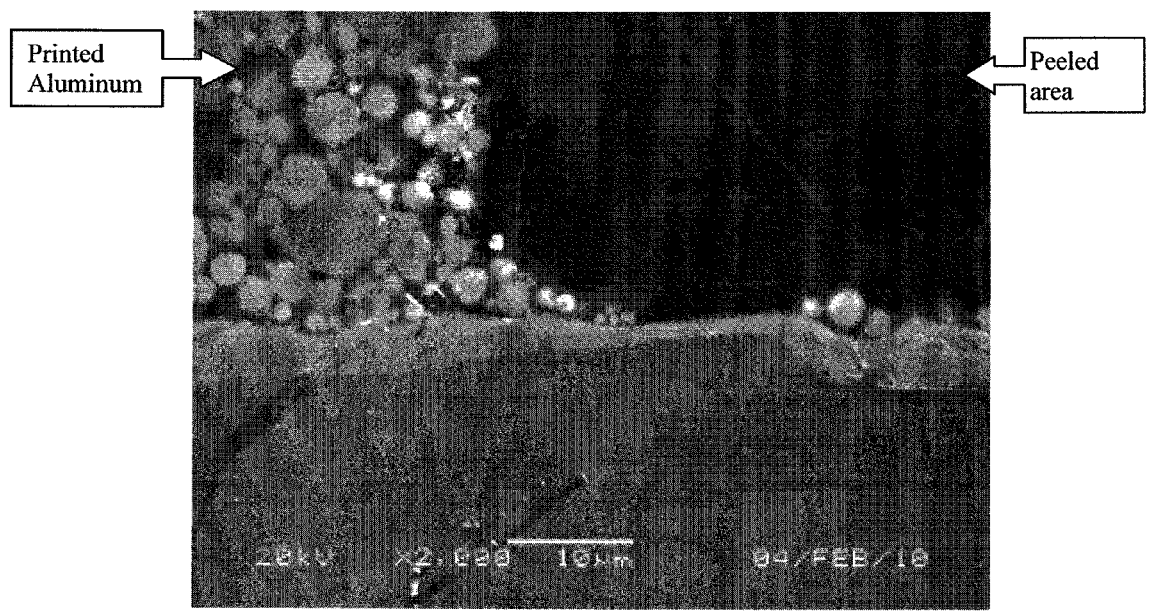
FIG. 10 is an SEM photograph of a BSF under the aluminum and peeled off section of a solar cell according to an embodiment of the invention.
Figure 11:
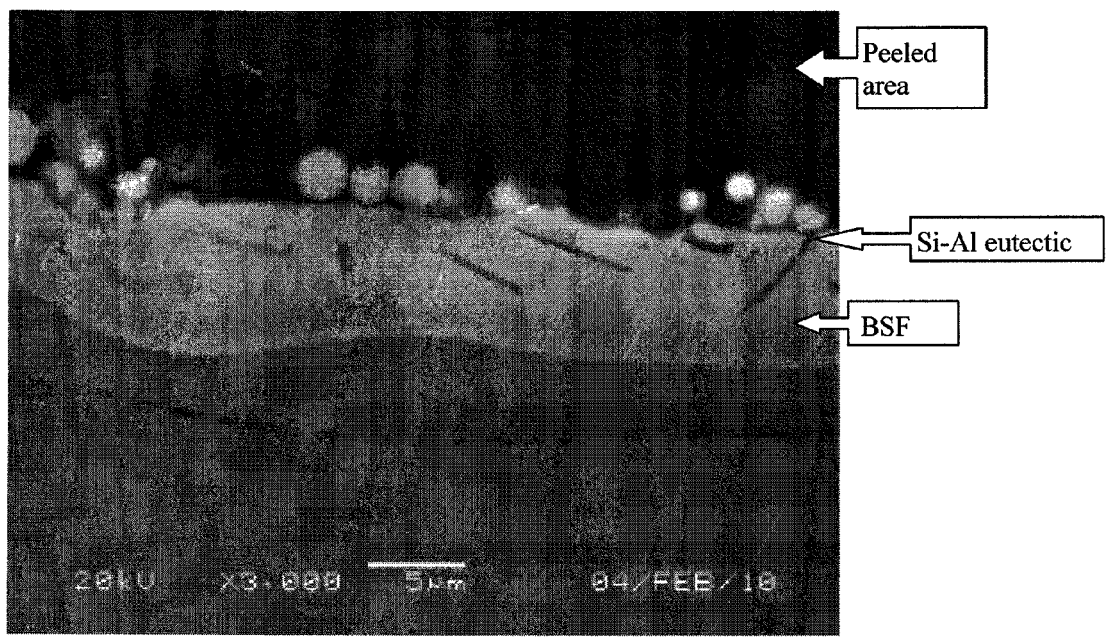
FIG. 11 is an SEM photograph of a BSF under a peeled off section of a solar cell according to an embodiment of the invention.

Following firing, SEM pictures of cross-sections of the back surface field were taken to examine the BSF quality. As shown in FIGS. 10-11, the aluminum layer (BSF) was formed continuously under the aluminum and under the peeled off areas. The excess aluminum layer was removed almost completely by the peeling paste and provided a solid clean surface for the next processing step of applying back contact silver layer for soldering and connecting purpose. FIG. 10 shows the continuous Al BSF layer that is formed under the Al and under the peeled off areas, whereas FIG. 11 shows the BSF under the peeled off areas at a higher magnification.

Figure 12:
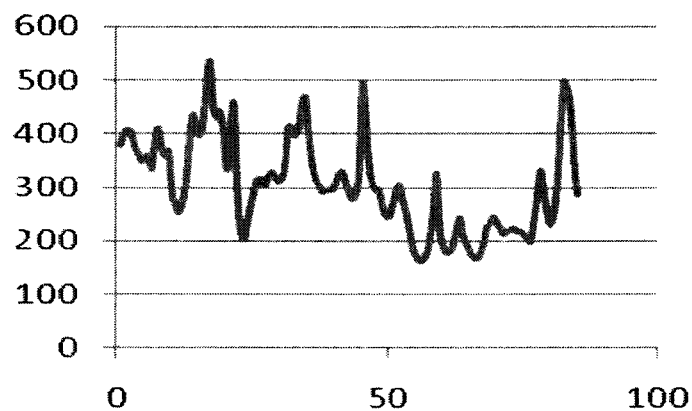
FIG. 12 is a graph of adhesion vs. distance for a solar cell according to an embodiment of the invention.

In order to evaluate the adhesion of the cells, solder coated copper wires (2 mm wide, 200 μm thick) were soldered onto the back side silver to produce solder joints. Flux was applied to the joint and the wires were soldered to the back side silver at 300° C. A soldering iron was used to heat the solder and have it flow onto back side silver. The copper wires were cut to ~10" in length so that there was a 4" lead hanging off one end of the 6" solar cells. The copper lead wires were attached to a force gauge and the cell was affixed to a stage that moved away from the force gauge at a constant speed. A computer was attached to the force gauge to record instantaneous forces. Adhesion was measured by pulling the wire at a 180° angle relative to the joint. Multiple data points were collected and the resulting adhesion profile is shown in FIG. 12.
Preparation and Analysis of Comparative Solar Cells Conventional solar cells were prepared on a 6"×6" multi crystalline wafer and on a 5"×5" single crystalline wafer by printing and drying back contact silver, printing and drying back aluminum, and printing and drying front contact silver. All applied silver and aluminum pastes were commercially available pastes, and all drying was performed at 150° C. for 5 minutes. Solar cells according to the invention were prepared on identical wafers as described above. The electrical performance of the comparative and inventive cells was measured as described above and the results for Voc are depicted graphically in FIGS. 13 and 14. It can be seen that there was a 4.5 mV gain in Voc of the inventive cell on the 6"×6" multi crystalline wafer and a 6.5 mV gain of the inventive cell on the 5"×5" single crystalline wafer. These results demonstrate the superior results obtained from a solar cell having a full BSF.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for applying a back contact silver busbar to an aluminum back surface filed (BSF) of a solar cell comprising:
   a. providing a solar cell substrate having a front side and a back side;
   b. printing a full aluminum backing layer on the back side of the solar cell substrate;
   c. drying the printed aluminum backing layer to yield a full aluminum layer;
   d. printing and drying a peeling paste on the full aluminum layer in areas where silver busbar is desired;
   e. printing and drying a front contact silver paste on the front side of the solar cell substrate to produce a front grid electrode;
   f. co-firing and cooling the front and back sides of the solar cell, wherein during firing the peeling paste wets excess aluminum powder in the aluminum layer, such that during cooling of the solar cell, the peeling paste contracts, solidifies, and peels off with the excess aluminum powder to leave a full aluminum BSF having open areas; and
   g. printing, drying, and firing a back contact silver paste on the open areas of the BSF to yield the silver busbar.

2. The method according to claim 1, wherein the solar cell substrate comprises monnocrystalline or multicrystalline silicon.

3. The method according to claim 1, wherein the co-firing step (f) is performed at a peak temperature of at least about 700-800 C.

4. The method according to claim 1, wherein the cooling in step (f) is performed at a rate of about 60 to 80 C per second.

5. The method according to claim 1, wherein the firing in step (g) is performed at about 500 C.

6. The method according to claim 1, wherein the peeling paste comprises:
   a. a powder system in an amount of 30-80% by weight of the paste and having a particle size of about 0.1 to 5.0 microns;
   b. a glass system in an amount of 3 to 20% by weight of the paste and having a particle size of about 0.1 to 4.5 microns and a Tg of 300 to 800 C; and
   c. an organic system in an amount of 10-30% by weight of the paste.

7. The method according to claim 1, wherein the back contact silver paste fires at less than about 550 C.

8. The method according to claim 1, wherein the peeling paste comprises:
   a. at least one type of the particles selected from the group consisting of silver particles, copper particles, and metal oxide particles, wherein the particles have a particle size of 0.1 to 5.0 microns;
   b. glass frit having a particle size of 0.1 to 4.5 microns a Tg of 300 to 800 C; and
   c. an organic vehicle.

9. Solar cell formed by the method of claim 1.

10. The solar cell according to claim 9, wherein the co-firing in step (f) is performed at a peak temperature of at least about 700-800 C.

11. The solar cell according to claim 9, wherein the cooling in step (f) is performed at a rate of about 60 to 80 C per second.

12. The solar cell according to claim 9, wherein the firing in step (g) is performed at about 500 C.

13. The solar cell according to claim 9, wherein the peeling paste comprises:
 a. a powder system in an amount of 30-80% by weight of the paste and having a particle size of about 0.1 to 5.0 microns;
 b. a glass system in an amount of 3 to 20% by weight of the paste and having a particle size of about 0.1 to 4.5 microns and a Tg of 300 to 800 C; and
 c. an organic system in an amount of 10-30% by weight of the paste.

14. The solar cell according to claim 9, wherein the back contact silver paste is fired at less than about 550 C.

15. The solar cell according to claim 9, wherein the peeling paste comprises:
 a. at least one type of particles selected from the group consisting of silver particles, copper particles, and metal oxide particles, wherein the particles have a particle size of 0.1 to 5.0 microns;
 b. glass frit having a particle size of 0.1 to 4.5 microns and a Tg of 300 to 800 C; and
 c. an organic vehicle.

\* \* \* \* \*